(12) United States Patent
Derat et al.

(10) Patent No.: US 9,335,358 B2
(45) Date of Patent: May 10, 2016

(54) SYSTEM FOR MEASURING AN ELECTROMAGNETIC FIELD

(75) Inventors: Benoit Derat, Meudon (FR); Stephane Pannetrat, Orsay (FR); Andrea Cozza, Paris (FR)

(73) Assignee: ART-Fi, Orsay (FR)

( * ) Notice: Subject to any disclaimer, the term of this patent is extended or adjusted under 35 U.S.C. 154(b) by 707 days.

(21) Appl. No.: 13/520,182

(22) PCT Filed: Dec. 31, 2010

(86) PCT No.: PCT/EP2010/070960
§ 371 (c)(1),
(2), (4) Date: Jun. 30, 2012

(87) PCT Pub. No.: WO2011/080332
PCT Pub. Date: Jul. 7, 2011

(65) Prior Publication Data
US 2013/0099119 A1    Apr. 25, 2013

(30) Foreign Application Priority Data

Dec. 31, 2009   (FR) .................................. 09 59690

(51) Int. Cl.
*G01T 1/17*   (2006.01)
*G01R 29/08*  (2006.01)
*G01T 7/00*   (2006.01)
*G01T 1/16*   (2006.01)

(52) U.S. Cl.
CPC ............ *G01R 29/08* (2013.01); *G01R 29/0878* (2013.01); *G01T 1/16* (2013.01); *G01T 1/17* (2013.01); *G01T 7/00* (2013.01)

(58) Field of Classification Search
CPC ................ G01T 1/17; G01T 1/16; G01T 7/00
USPC ........................................................ 250/336.1
See application file for complete search history.

(56) References Cited

U.S. PATENT DOCUMENTS

| 6,005,532 | A  | * | 12/1999 | Ng .................................. 343/867 |
| 6,239,764 | B1 | * | 5/2001  | Timofeev et al. .............. 343/795 |
| 6,359,596 | B1 | * | 3/2002  | Claiborne ...................... 343/795 |
| 6,362,790 | B1 | * | 3/2002  | Proctor et al. ................. 343/702 |

(Continued)

FOREIGN PATENT DOCUMENTS

| FR | EP1605270 A1 | 12/2005 |
| FR | 2901062 A1   | 11/2007 |
| FR | 2930844 A1   | 11/2009 |

OTHER PUBLICATIONS

PCT/EP2010/070960 International Preliminary Report on Patentability, Mar. 22, 2012, European Patent Office Gitschiner Str. 103 D-10958 Berlin.

*Primary Examiner* — Christine Sung
(74) *Attorney, Agent, or Firm* — The Jansson Firm; Pehr B. Jansson

(57) ABSTRACT

(EN) A system (MSY) for measuring an electromagnetic field comprises an antenna device disposed on a plane (AB1). The antenna device is arranged to provide a pa it of signals representative of a pair of orthogonal components of the electromagnetic field. A printed circuit (PT1) for signal transmission is orthogonally disposed with respect to the plane (AB1) on which the antenna device is disposed. The printed circuit (PT1) comprises a transmission line coupled to the antenna device to transmit the pair of signals provided by the antenna device towards a measurement module.

16 Claims, 8 Drawing Sheets

(56) References Cited

U.S. PATENT DOCUMENTS

| | | |
|---|---|---|
| 7,268,564 B2 * | 9/2007 | Ozaki et al. .................... 324/632 |
| 2005/0078046 A1 * | 4/2005 | Theobold et al. ............. 343/797 |
| 2005/0179598 A1 | 8/2005 | Legay et al. |
| 2008/0030418 A1 * | 2/2008 | Brachat et al. ................ 343/810 |
| 2012/0262354 A1 * | 10/2012 | He et al. ........................ 343/767 |

* cited by examiner

SYSTEM FOR MEASURING AN ELECTROMAGNETIC FIELD

TECHNICAL FIELD

An aspect of the invention relates to a system for measuring an electromagnetic field, in particular in near-field conditions. The system may be used, for example, to determine a specific absorption rate (SAR). Another aspect of the invention relates to a method of measuring an electromagnetic field involving such a system.

BACKGROUND ART

A measurement of specific absorption rate typically involves a three-dimensional characterization of an electromagnetic field in near-field conditions. The electromagnetic field penetrates a three-dimensional object such as, for example, a mannequin filled with a medium simulating a biological tissue. The electromagnetic field has an amplitude that can vary considerably from one point to another within the object. In order to determine the specific absorption rate, the amplitude of the electromagnetic field must be determined at many points in the object. A state-of-the-art approach consists in using a basic probe that comprises a single antenna device, which is arranged to measure three orthogonal components (X, Y, and Z) of the electromagnetic field. The basic probe is moved within the object so that the basic probe is successively located at various points. The basic probe then measures the amplitude of the electromagnetic field at these various points. However, this is a relatively slow process.

The patent publication WO 2004/079299 describes a method of measuring a specific absorption rate (SAR) in a phantom filled with a liquid, which reconstitutes the dielectric properties of a biological tissue. The phantom is exposed to a microwave emission from an antenna. The amplitude and phase of the electric field inside the phantom is measured for a plurality of points on a given surface, which is defined in a concentration near-field zone of the electric field. A near-field near-field transformation from the data measured on the surface is performed so as to determine the electric field in the volume inside the phantom. The value of the SAR is then calculated.

In more detail, the aforementioned patent publication describes a network of probes formed by a squared thin rigid substrate having sides of 70 mm and carrying 36 bipolarized probes. Each probe is formed by 4 separate strips etched in cross on a printed circuit substrate. Each strip of each dipole is connected to the central core of a thin vertical coaxial cable. Thus, two cables are connected to the two strips of the same dipole. These cables are connected to the terminals of a balun device. A bipolarized probe thus requires two separate baluns and four coaxial cables. The four coaxial cables are coupled to each other to ensure contact between the shields and so that the four strips are close without touching each other.

SUMMARY OF THE INVENTION

There exists a need for a practical solution that allows measuring an electromagnetic field in a relatively fast and precise way, in particular in near field conditions. In order to better address this need, the following aspects have been taken into consideration.

There is a precaution to be taken in order to characterize an electromagnetic field in a relatively precise way on the basis of measurements of two orthogonal components of the electromagnetic field. A signal representative of a component can interfere with another signal representative of the other component, and vice versa. Such interference may result in an insufficient precision, unless this interference is compensated for, which is generally difficult to achieve and thus expensive.

In the method described in the patent publication identified hereinbefore, the interference in question may be relatively weak thanks to the coaxial cables used to transmit signals representative of two orthogonal components coming from the network of probes. However, the network of probes requires many coaxial cables, which considerably complicates an implementation of the method and involves high costs. Moreover, the coaxial cables may influence the electromagnetic field to be measured, which may result in an insufficiently precise measurement.

According to an aspect of the invention, a system for measuring an electromagnetic field comprises:
  an antenna device disposed at a particular location on a plane substrate, the antenna device being arranged to provide a pair of signals representative of a pair of orthogonal components of the electromagnetic field at the particular location where the antenna device is located; and
  a printed circuit for signal transmission, the printed circuit being orthogonally disposed with respect to the plane substrate on which the antenna device is disposed, the printed circuit including a transmission line coupled to the antenna device, the transmission line comprising a first and a second signal conductor arranged to transmit the pair of signals provided by the antenna device towards a measurement module.

The Inventors established that it is possible to measure an electromagnetic field in a sufficiently precise way while using transmission lines implemented on a printed circuit for transmitting signals representative of two orthogonal components of the electromagnetic field. The use of printed circuits for transmitting such signals considerably facilitates achieving an electromagnetic field measurement in a relatively fast and precise way in particular in near-field conditions. Moreover, in comparison with a measurement system that uses coaxial cables for transmitting such signals, a measurement system that uses printed circuits offers a higher degree of freedom in achieving that the measurement system influences the electromagnetic field only a relatively small extent.

An implementation of the invention advantageously comprises one or more of the following additional features, which are described In the following paragraphs. These additional features contribute to achieving practical implementations that allow measuring an electromagnetic field in a relatively fast and precise way.

An antenna device advantageously comprises a first element and a second element orthogonally disposed with respect to each other, and a common reference element. Such an antenna device provides single-ended output signals, which typically require less complicated transmission line structures than differential output signals.

The antenna device. Is advantageously implemented on a printed circuit.

The printed circuit for signal transmission is advantageously provided with an extending portion having a pair of main faces at opposite sides of the extending portion. One of the main faces comprises a first conducting area coupled to a first signal conductor of the transmission line. The other main face comprises a second conducting area and a third conducting area coupled to a second signal conductor and a reference conductor, respectively, of the transmission line. The printed circuit on which the antenna device is implemented comprises a slot arranged to accommodate the extending portion. The slot has a pair of longitudinal edges. A portion of the first element is located at one of the longitudinal edges so that the first element is connectable by soldering to the first conducting area of the extending portion. A portion of the second element and a portion of the common reference element are located at the other longitudinal edge of the slot, so that the second element and the common reference element are connectable by soldering to the second conducting area and the third conducting area, respectively, of the extending portion. These additional features allow an easy yet reliable assembly of the printed circuit on which the antenna device is implemented and the printed circuit for signal transmission.

The printed circuit for signal transmission advantageously comprises: a pair of external conducting layers at opposite sides of the printed circuit, several internal conducting layers, and several non-conducting layers, a non-conducting layer separating two conducting layers.

The first conducting area of the extending portion advantageously constitutes an end of a first conducting path belonging to a first internal conducting layer. The second conducting area and the third conducting area constitute an end of a second conducting path and an end of a third conducting path, respectively, belonging to a second internal conducting layer. The first conducting path, the second conducting path, and the third conducting path correspond with the first signal conductor, the second signal conductor, and the reference conductor, respectively, in a non-surfacing section of the transmission line.

The first conducting path, the second conducting path, and the third conducting path are advantageously positioned with respect to each other so that there is minimal interference between a signal present on the first conducting path and a signal present on the second conducting path.

The transmission line advantageously comprises a surfacing section in the form of a pair of micro-strip lines formed by a first conducting strip and a second conducting strip belonging to an external conducting layer, and by a third conducting strip belonging to an internal conducting layer. The first conducting strip, the second conducting strip, and the third conducting strip correspond to the first signal conductor, the second signal conductor, and the reference conductor, respectively, in the surfacing section of the transmission line. The transmission line further comprises a transition section provided with conducting through-holes for electrically coupling the first conducting strip, the second conducting strip, and the third conducting strip with the first conducting path, the second conducting path, and the third conducting path, respectively, of the non-surfacing section. These additional features allow the printed circuit for signal transmission to be provided with electrical circuits in a relatively simple manner.

The second conducting path and the third conducting path are advantageously separated from each other by a specific distance so that these conducting paths constitute a two-wire transmission line having a characteristic impedance corresponding to a characteristic impedance of a micro-strip line formed by the second conducting strip and the third conducting strip.

The printed circuit for signal transmission advantageously comprises several transmission lines comparable with the transmission line defined hereinbefore. At least a portion of the pair of the external conducting layers is part of a shielding for preventing the electromagnetic field from reaching the transmission lines.

A series of conducting through-holes is advantageously arranged between two non-surfacing sections of two neighboring transmission lines. The series of conducting through-holes extends between the pair of external conducting layers so that the series of conducting through-holes is part of the shielding.

The printed circuit for signal transmission typically generates a diffraction of the electromagnetic field. The printed circuit for signal transmission advantageously comprises a pair of peripheral zones at sides opposite of a central zone in which the transmission lines are located. A peripheral zone comprises a conducting structure arranged to generate an echo of the electromagnetic field in phase opposition with the diffraction.

The conducting structure advantageously comprises a pair of conducting planes formed in the pair of external conducting layers and further comprises at least a portion of the conducting through-holes extending between the pair of conducting planes, the conducting through-holes forming an edge of the conducting structure.

The printed circuit for signal transmission is advantageously provided with a cover that is part of the shielding and covering at least the surfacing sections of the transmission lines.

The system advantageously comprises several arrays of antenna devices, the arrays being arranged in parallel, and several printed circuits for signal transmission. A printed circuit for signal transmission is associated with a particular array of antenna devices. The measuring circuit is arranged to establish a three-dimensional representation of the electromagnetic field on the basis of respective pairs of signals coming from respective antenna devices belonging to respective arrays.

For the purpose of illustration of the invention, as well as the additional features, a detailed description of particular embodiments is provided with reference to drawings.

BRIEF DESCRIPTION OF THE DRAWINGS

FIG. 10 is a schematic diagram illustrating the front view of the probe module after removal of a cover there from.

DETAILED DESCRIPTION

Figure 1:
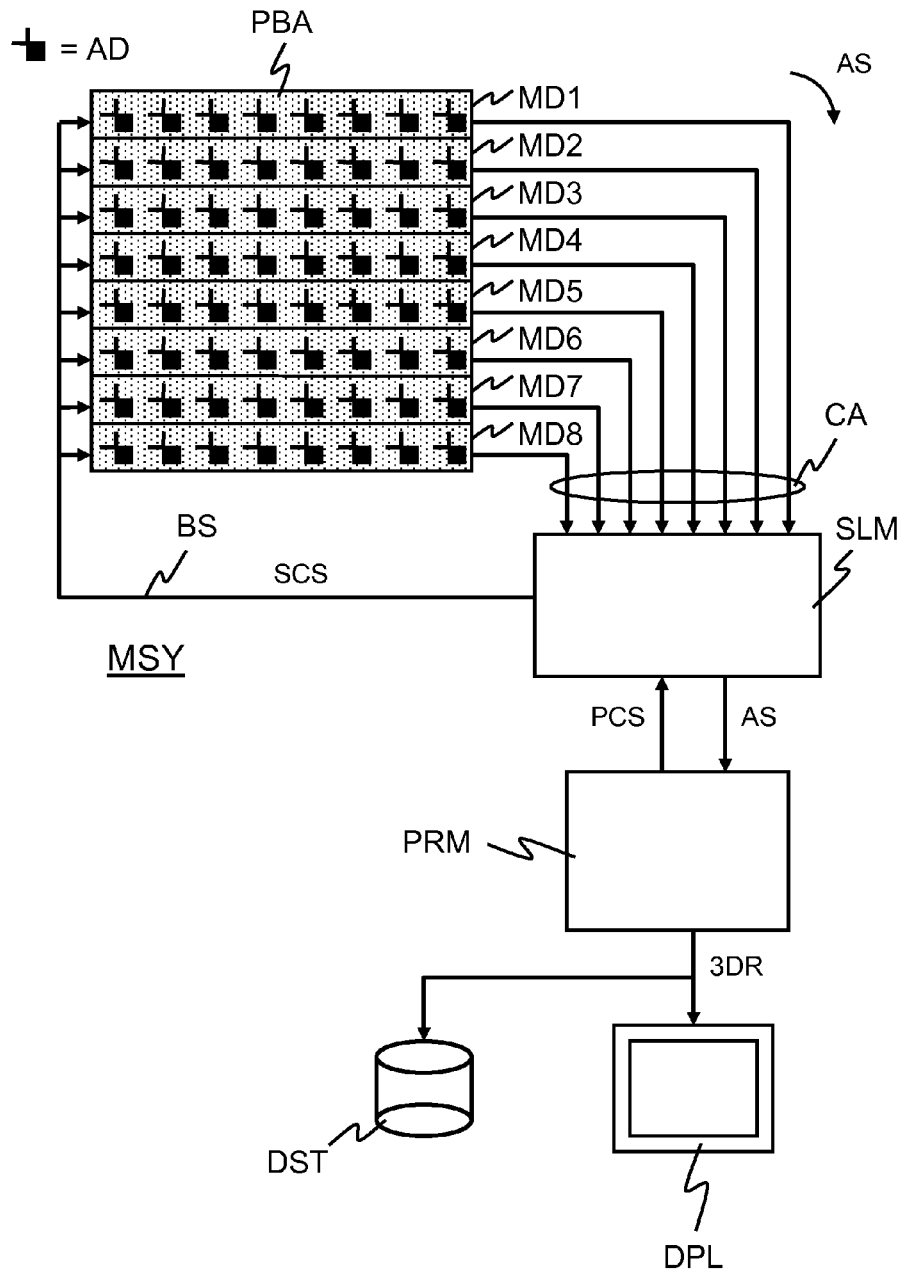
FIG. 1 is a block diagram illustrating a system for measuring an electromagnetic field.

FIG. 1 illustrates a system MSY for measuring an electromagnetic field. The system MSY comprises an assembly of probe modules PBA, a selection module SLM, a processing module PRM, a display device DPL, and a data storage device DST. The assembly of probe modules PBA comprises a plurality of antenna devices AD distributed on several probe modules MD1-MD8. A probe module comprises an array of antenna devices AD, which may be disposed on a single plane or various planes. A set of cables CA extends between the assembly of probe modules PBA and the selection module SLM. There is at least one cable for each probe module, which connects this probe module to the selection module SLM. An address bus BS connects each probe module to the selection module SLM.

The system MSY illustrated in FIG. 1 basically operates as follows. An antenna device AD provides a pair of signals representative of orthogonal components of the electromagnetic field. For example, one component can be designated as "horizontal" and the other component can be designated as "vertical". Following this terminology, an antenna device AD thus provides a signal representative of the horizontal component of the electromagnetic field and another signal representative of the vertical component.

The system MSY carries out a scanning of the assembly of probe modules PBA so that the processing module PRM successively receives signals coming from a set of antenna devices AD, which is subject to the scanning. More specifically, the processing module PRM successively receives the signal representative of the horizontal component of the electromagnetic field and the signal representative of the vertical component coming from each antenna device AD, which is subject to the scanning.

The scanning may be carried out in the following way. The processing module PRM provides a primary selection signal PCS, which successively selects the antenna devices AD that are subject to the scanning. Moreover, the primary selection signal PCS successively selects for each antenna device AD the horizontal component and the vertical component of the electromagnetic field. The primary selection signal PCS can thus also be regarded as selecting a particular antenna signal AS at a given instant. This currently selected antenna signal AS comes from the antenna device that is currently selected and represents the horizontal component or the vertical component of the electromagnetic field, whichever is selected.

In response to the primary selection signal PCS, the selection module SLM selects a cable among the set of cables CA This selected cable connects the selection module SLM to the probe module MD* where the currently selected antenna device is located (the sign * represents a number indicating this probe module). The selection module SLM applies a secondary selection signal SCS to the address bus BS. The secondary selection signal SCS indicates a particular antenna device among the antenna devices AD that are present on the probe module MD*. Moreover, the secondary selection signal SCS selects the horizontal component or the vertical component of the electromagnetic field. Thus, the currently selected antennas signal AS appears on the selected cable. The selection module SLM transfers this signal from currently selected antenna device to the processing module PRM.

Accordingly, the processing module PRM receives a series of antenna signals AS, which represent a sampling of the electromagnetic field on a surface covered by the antenna devices AD that are subject to the scanning. This surface will be called "measurement surface" hereinafter. The respective locations of the antenna devices AD, which are subject to the scanning, constitute a set of sampling points. The antenna signals AS comprise amplitude information and phase information of two orthogonal components of the electromagnetic field for each sampling point.

The processing module PRM establishes a three-dimensional representation 3DR of the electromagnetic field in a given volume on the basis of the series of antenna signals AS obtained by the scanning of the assembly of probe modules PBA. The series of antenna signals AS characterizes the electromagnetic field in a horizontal dimension "X" and in a vertical dimension "Y". In effect, the processing module PRM is capable of adding an additional dimension "Z" that is orthogonal with respect to the horizontal dimension "X" and the vertical dimension "Y". For example, by applying Maxwell's equations, the processing module PRM can determine a third component "Z" of the electromagnetic field at a place where an antenna device AD is located on the basis of the horizontal component "X" and the vertical component "Y", which are represented by the signals coming from the antenna device AD.

In a more general way, the processing module PRM is able to carry out a reconstruction of the electromagnetic field at non-measured locations, that is, at locations outside the measurement surface. This is possible thanks to the fact that the series of antenna signals AS convey amplitude information and phase information on two orthogonal components of the electromagnetic field, and this for various locations on the measurement surface.

The processing module PRM may use, for example, transformations of the FFT type in order to establish the three-dimensional representation 3DR of the electromagnetic field in the given volume (FFT is an acronym for Fast Fourier Transformation). In accordance with a particular implementation, the processing module PRM applies an FFT transformation to a data matrix that constitutes a two-dimensional spatial representation of the electromagnetic field at the measurement surface. This FFT transformation produces an equivalent spectral representation. Then, the processing module PRM applies a propagation operator in the "Z" dimension to the equivalent spectral representation. This produces a spectral representation of the electromagnetic field at a surface that is shifted with respect to the measurement surface in the "Z" dimension. The processing module PRM applies an IFFT transformation to this last mentioned spectral representation; the IFFT transformation being opposite to the FFT transformation. A data matrix is thereby obtained, which constitutes a two-dimensional spatial representation of the electromagnetic field at the shifted surface. The processing module PRM can produce the three-dimensional representation 3DR of the electromagnetic field in a relatively short time by determining respective spatial representations of the electromagnetic field for respective surfaces, which are differently shifted with respect to the measurement surface.

The display device DPL allows visualizing the three-dimensional representation 3DR of the electromagnetic field produced by the processing module PRM. The three-dimensional representation 3DR may also be stored in the data storage device DST. Other data relating to the electromagnetic field, as well as measurement parameters, may also be stored in the data storage device DST and visualized, if required.

The system MSY illustrated in FIG. 1 may advantageously be used for determining a specific absorption rate (SAR). In order to do so, the assembly of probe modules PBA may be placed in a mannequin filled with a medium having dielectric characteristics similar to those of a biological tissue. The mannequin may simulate the head of a human being. An apparatus emitting an electromagnetic field, such as, for example, a mobile phone, is placed close to the mannequin. The specific absorption rate is representative of the electromagnetic power locally absorbed in the head.

In what follows, it is assumed that the system MSY illustrated in FIG. 1 is used for determining the specific absorption rate. By way of example, it is further assumed that the following characteristics apply. The electromagnetic field comprises frequency components that are located in a range from approximately a few hundred MHz to approximately a few GHz. The medium simulating biological tissue has a relative permittivity compatible with standard EN62209-1, which is typically about 40. This implies a typical wavelength range from a few millimeters to a few tens of millimeters. For example, the electromagnetic field may have a minimal wavelength of 7 mm and a maximum wavelength of 60 mm. Near-field conditions apply for determining the specific absorption rate: the assembly of probe modules PBA illustrated in FIG. 1 will be relatively close to the apparatus emitting the electromagnetic field, only a few wavelengths away.

Figure 2:
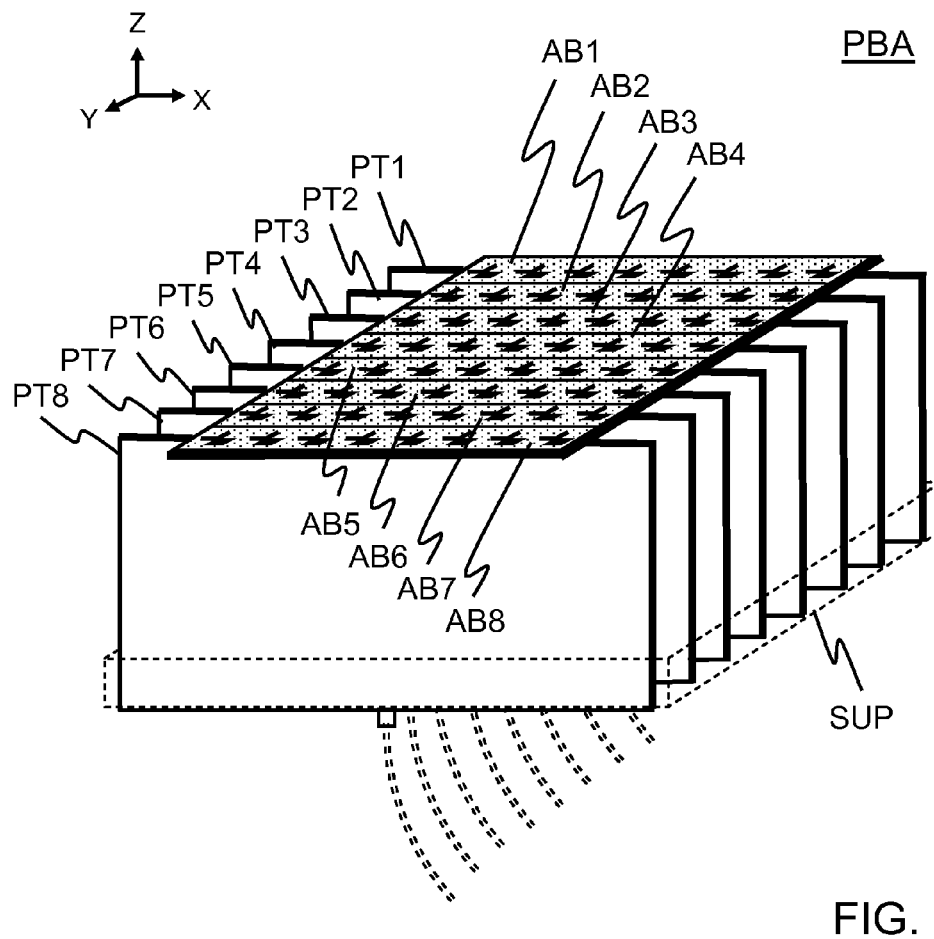
FIG. 2 is a schematic diagram illustrating a perspective view of an assembly of probe modules capable of providing signals representative of the electromagnetic field.

FIG. 2 illustrates an example of the assembly of probe modules PBA in more detail by means of a perspective view. According to this example, the assembly of probe modules PBA comprises several antenna bars AB1-AB8 and several printed circuits PT1-PT8 for transmission of signals. A probe module MD* comprises a combination of an antenna bar AB* and a printed circuit PT* for transmission of signals (the sign * represents any number ranging between 1 and 8). The assembly of probe modules PBA may comprise a support SUP for mechanically fixing the probe modules and for defining geometrical positions that these modules have with respect to each other. A system of axes "X", "Y", and "Z" is indicated in FIG. 2 by means of three arrows, each one representing a particular axis. These axes "X", "Y", and "Z" correspond to the dimensions "X", "Y", and "Z", respectively, mentioned hereinbefore.

The antenna bar AB* of a probe module MD* constitutes a plane on which the array of antenna devices AD is disposed. The antenna bars AB1-AB8 may be in the form of, for example, a printed circuit in which the antenna devices AD have been formed by means of etching. The printed circuit may be, for example, of type FR4. The printed circuit for signal transmission may be of the same type.

The printed circuit for signal transmission PT* is orthogonally disposed with respect to the antenna bar AB*. That is, the printed circuit for signal transmission is orthogonally disposed with respect to the plane on which the array of antenna devices AD is disposed. The printed circuit PT* for transmission of signals comprises several transmission lines: typically a transmission line for each antenna device AD present on the antenna bar. A transmission line transmits a pair of signals coming from the antenna device AD to which it belongs, in the direction of the cable connecting the probe module MD* to the selection module SLM illustrated in FIG. 1. This will be described in greater detail hereinafter.

It should be noted that the antenna bars AB1-AB8 may geometrically be disposed in various different ways. For reasons of simplicity, FIG. 2 illustrates a basic arrangement in which the antenna bars AB1-AB8 form a flat surface. However, the antenna bars AB1-AB8 may be disposed differently so that these form, for example, a curved surface. In order to do so, some probe modules may be shifted along axis "Z". The support SUP illustrated in FIG. 2 may be designed to provide such a shift. In an alternative way, it is also possible to provide for probe modules having different heights; a particular height corresponding to a particular distance along the axis "Z". In such an implementation, the printed circuits PT1-PT8 for transmission of signals will have different dimensions.

Figure 3:
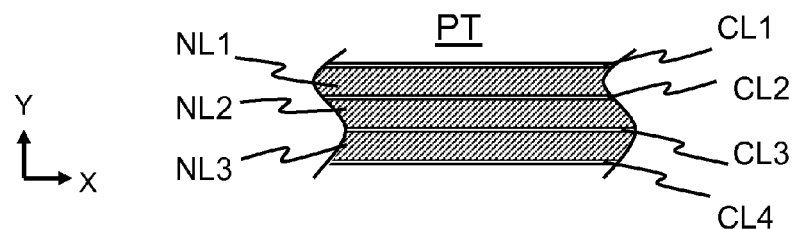
FIG. 3 is a schematic diagram illustrating a cut view of a printed circuit for signal transmission in a probe module.

FIG. 3 illustrates a transversal structure of a printed circuit PT for transmission of signals. This printed circuit PT is representative of the printed circuits PT1-PT8 for transmission of signals present in the assembly of probe modules PBA illustrated in FIG. 2. The printed circuit PT for transmission of signals comprises four conducting layers CL1-CL4 and three non-conducting layers NL1-NL3 according to a sandwich structure. That is, a non-conducting layer separates two conducting layers. Conducting layers CL1 and CL4 constitute a pair of external conducting layers. Other conducting layers CL2 and CL3 are inside the printed circuit for signal transmission and will collectively be designated internal conducting layers CL2, CL3 hereinafter.

In what follows, a probe module will be described in greater detail with reference to the FIGS. 4-18. This probe module is representative of the probe modules MD1-MD8 present in the assembly of probe modules PBA illustrated in FIGS. 1 and 2.

Figure 4:
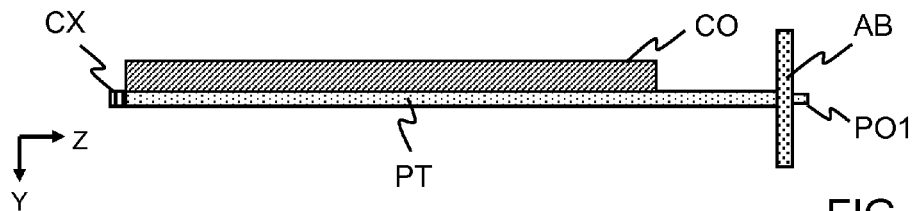
FIG. 4 is a schematic diagram illustrating a side view of a probe module.

FIG. 4 schematically illustrates the probe module by means of a side view in the direction of the arrow representing the axis "X" in FIG. 2. The probe module comprises an antenna bar AB and a printed circuit PT for transmission of signals. The printed circuit PT for transmission of signals is provided with a cover CO. Preferably, the cover CO is made of conducting matter, such as a metal or an alloy. The printed circuit PT for transmission of signals is provided with a cable connector CX. This connector CX allows coupling the probe module with the selection module SLM illustrated in FIG. 1 via a cable. The printed circuit PT for transmission of signals may also include one or more bus connectors. FIG. 4 and the figures that follow do not illustrate such additional connectors for reasons of simplicity.

The printed circuit PT for transmission of signals comprises a first extending portion PO1, which traverses the antenna bar AB. The first extending portion PO1 comprises the two internal conducting layers CL2, CL3 illustrated in FIG. 3. The first extending portion PO1 also comprises the non-conducting layer NL2, which separates the two internal conducting layers. On the other hand, the first extending portion PO1 does not comprise the pair of external conducting layers CL1, CL4, and does not comprise the other non-conducting layers NL1, NL3 illustrated in FIG. 3.

Figure 5:
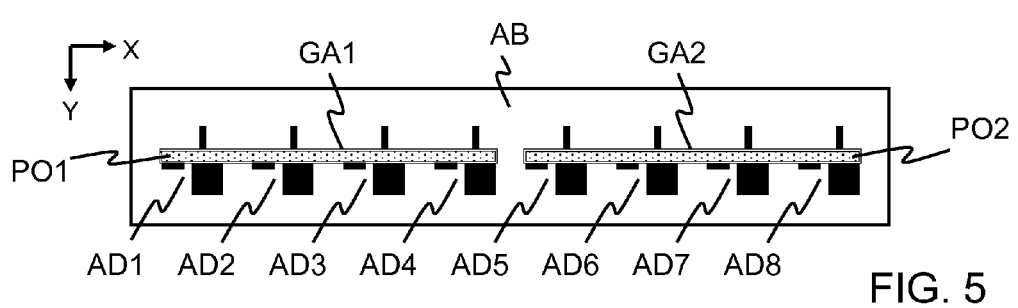
FIG. 5 is a schematic diagram illustrating a top view of the probe module.

FIG. 5 schematically illustrates the probe module by means of a top view in the direction opposite to that of the arrow representing axis "Z" in FIG. 2. The antenna bar AB comprises an array of eight antenna devices AD1-AD8. The antenna bar AB comprises two slots: a first slot GA1 and a second slot GA2. Four antenna devices AD1-AD4 are disposed along the first slot GA1. The four other antenna devices AD5-AD8 are disposed along the second slot GA2. In a manner of speaking, the first slot GA1 assembles the four antenna devices AD1-AD4, while the second slot GA2 assembles the four other antenna devices AD5-AD8.

The first slot GA1 accommodates the first extending portion PO1 of the printed circuit PT for transmission of signals. The second slot GA2 accommodates a second extending portion PO2 of the printed circuit PT for transmission of signals. The second extending portion PO2 is similar to the first extending portion PO1. That is, the second extending portion PO2 only comprises the two internal conducting layers CL2, CL3 and the non-conducting layer NL2 that separates these. FIG. 3 illustrates the aforementioned layers.

Figure 6:
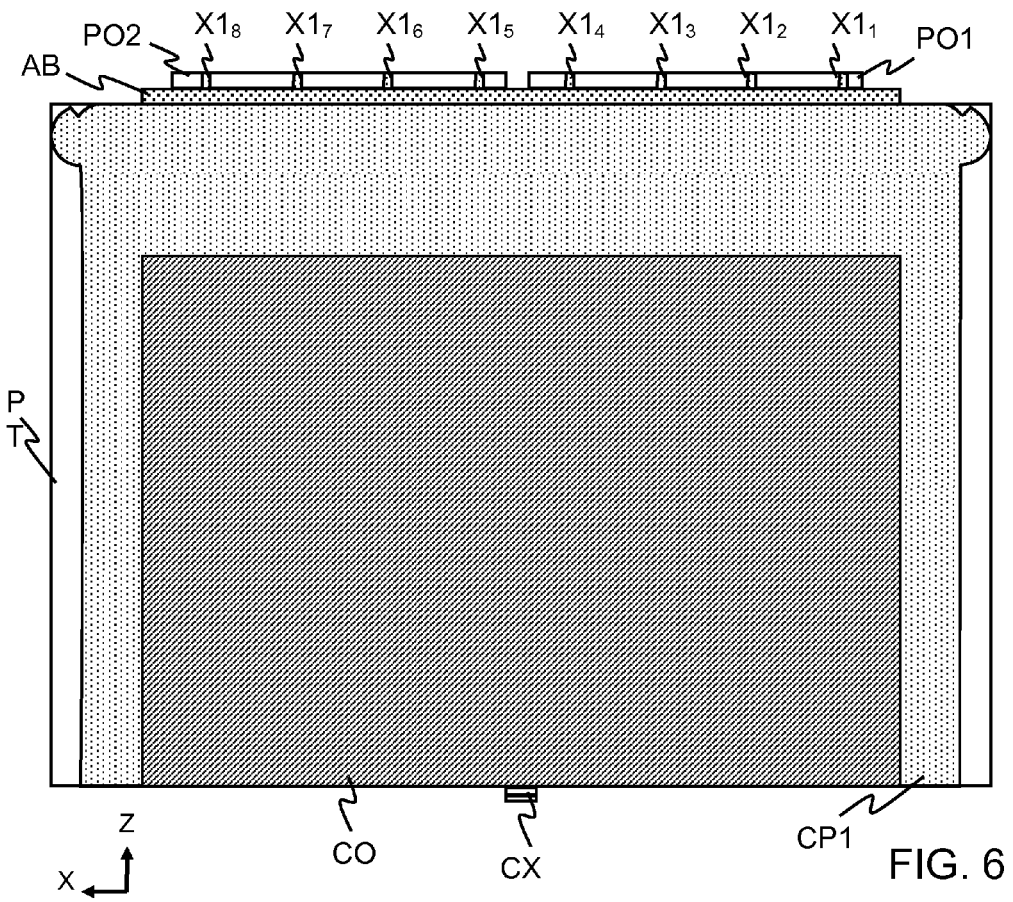
FIG. 6 is a schematic diagram illustrating a front view of the probe module.

FIG. 6 schematically illustrates the probe module by means of a front view in the direction of the arrow representing the axis "Y" in FIG. 2. The first extending portion PO1, which is on the right, comprises a first main face, which is shown in FIG. 6. In the same way, the second extending portion PO2, which is on the left, comprises a first main face, which is shown in FIG. 6. The cable connector CX and the cover CO mentioned hereinbefore with reference to FIG. 4 are also illustrated in FIG. 6.

The first main face of first extending portion PO1 illustrated in FIG. 6 comprises several first conducting areas $X1_1$-$X1_4$, four in total. There is a first conducting area for each antenna device AD1-AD4 disposed along the first slot GA1 illustrated in FIG. 5. The first main face of the second extending portion PO2 illustrate in FIG. 6 also comprises several first conducting areas $X1_5$-$X1_8$, four in total. There is a first conducting area for each antenna device AD5-AD8 disposed along the second slot GA2 illustrated in FIG. 5. The first conducting areas $X1_1$-$X1_8$ belong to one of two internal conducting layers CL2, CL3 illustrated in FIG. 3, in the present case conducting layer CL2.

The printed circuit PT for transmission of signals comprises a central zone that corresponds to the antenna bar AB in terms of width. The printed circuit PT for transmission of signals further comprises a pair of peripheral zones at opposite sides of the central zone. That is, there is a peripheral zone on the left of the central zone and a peripheral zone on the right of the central zone.

The printed circuit PT for transmission of signals comprises a first conducting plane CP1. The first conducting plane CP1 is formed in one of the two external conducting layers CL1, CL4 illustrated in FIG. 5, in the present case conducting layer CL1. The first conducting plane CP1 has a contour including two portions having a particular form that can be designated as "a parrot's beak". This particular form constitutes a choke for electromagnetic signals. Each of two peripheral zones mentioned hereinbefore comprises such a choke in the form of a parrot's beak. More precisely, a choke is located in an upper left corner of printed circuit PT for transmission of signals. Another choke is located in an upper right corner. These chokes will be described in greater detail hereinafter.

Figure 7:
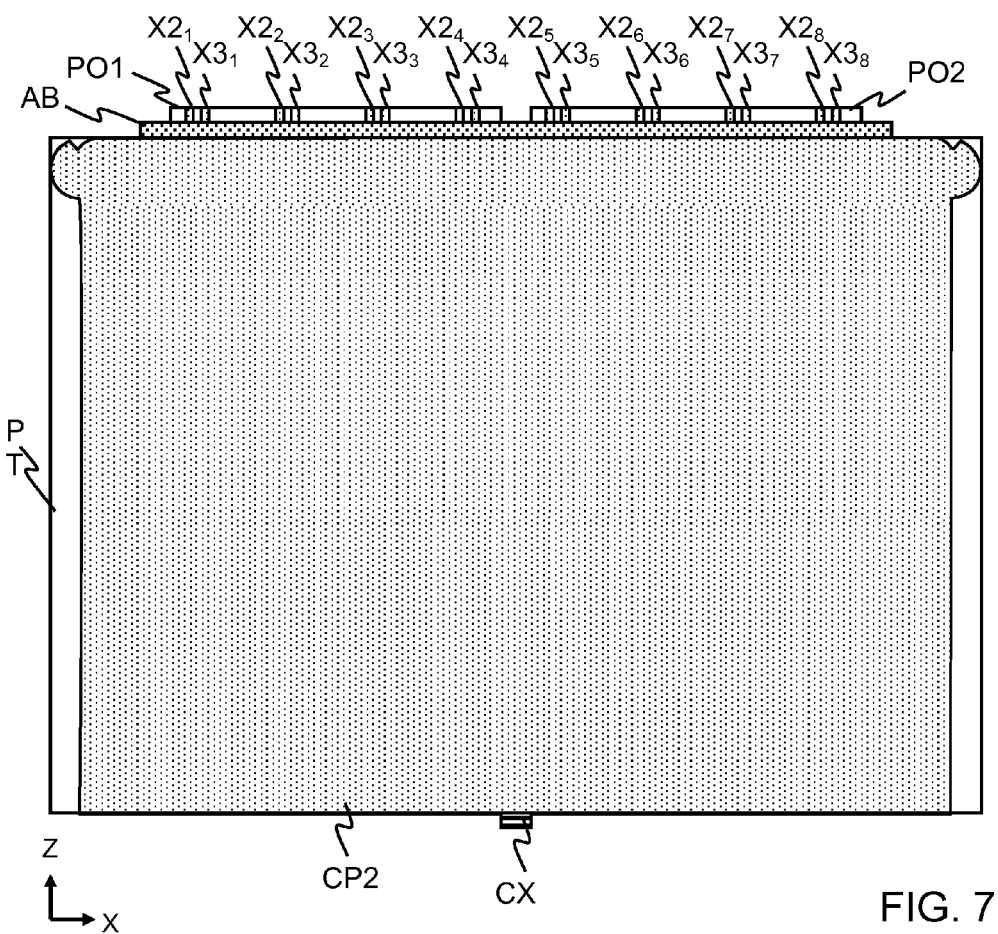
FIG. 7 is a schematic diagram illustrating a rear view of the probe module.

FIG. 7 schematically illustrates the probe module by means of a rear view in the direction opposite to that of the arrow representing the axis "Y" in FIG. 2. A second main face of the first extending portion PO1 is illustrated in FIG. 7, on the left of this figure. The second main face is opposite to the first main face of the first extending portion PO1 illustrated in FIG. 6, on the right of this figure. Similarly, a second main face of the second extending portion PO2 is illustrated in FIG. 7, on the right of this figure. The cable connector CX mentioned hereinbefore with reference to FIG. 4 is also illustrated in FIG. 7.

The second main face of the first extending portion PO1 illustrated in FIG. 7 comprises several second conducting areas $X2_1$-$X2_4$, four in total. This second main face further comprises several third conducting areas $X3_1$-$X3_4$, also four in total. There is a second conducting area and a third conducting area for each antenna device AD1-AD8 disposed along the first slot GA1 illustrated in FIG. 5. The second main face of the second extending portion PO2 illustrated in FIG. 7 also comprises several second conducting areas $X2_5$-$X2_8$, four in total, and comprises several third conducting areas $X3_5$-$X3_8$, also four in total. There is a second conducting area and a third conducting area for each antenna device AD5-AD8 disposed along the second slot GA2 illustrated in FIG. 5. The second conducting areas $X2_1$-$X2_8$ and third conducting areas $X3_1$-$X3_8$ belong to conducting layer CL3 illustrated in FIG. 3.

FIG. 7 shows that printed circuit PT for transmission of signals comprises a second conducting plane CP2. The second conducting plane CP2 belongs to conducting layer CL4 illustrated in FIG. 3. The second conducting plane CP2 is, at least partially, complementary with the first conducting plane CP1 illustrated in FIG. 6. Consequently, the second conducting plane CP2 has a contour including two portions with "a parrot's beak". These parrot's beaks are similar and symmetrical compared to those present in first conducting plane CP1 illustrated at FIG. 6. That is, the second conducting plane CP2 comprises a parrot's beak located in an upper left corner of printed circuit PT for transmission of signals. This parrot's beak faces the parrot's beak in the upper right corner illustrated in FIG. 6. The second conducting plane CP2 comprises another parrot's beak in an upper right corner. This parrot's beak faces the parrot's beak in the upper left corner illustrated in FIG. 6.

Figure 8:
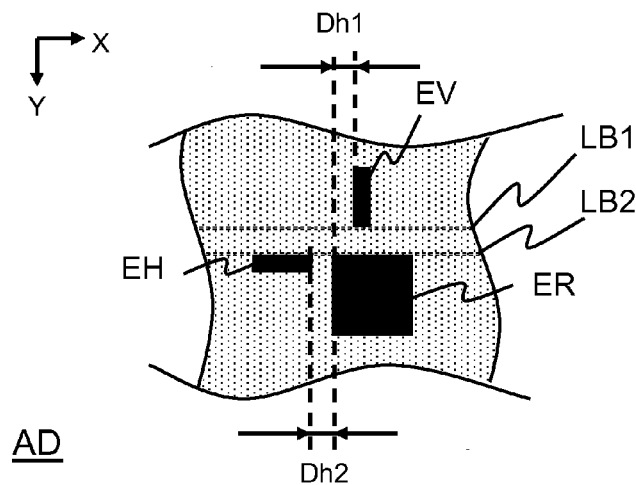
FIG. 8 is a schematic diagram illustrating an antenna device within the probe module.

FIG. 8 illustrates in more detail an antenna device AD representative of the antenna devices AD1-AD8, which are present on the antenna bar AB illustrated in FIG. 5. FIG. 8 can be regarded as a zoom-in on one of the eight antenna devices AD1-AD8 illustrated in FIG. 5. A longitudinal upper edge LB1 and a longitudinal lower edge LB2, which form a pair, are represented in FIG. 8. The pair of longitudinal edges LB1, LB2 belongs to slot GA1 or slot GA2 depending on whether the antenna device AD, which is zoomed in upon, belongs to sub-array AD1-AD4 or sub-array AD5-AD8, respectively. These slots GA1, GA2 each have a width corresponding to a distance between longitudinal edges LB1, LB2.

The antenna device AD comprises two sensors elements EV, EH, which are orthogonal with respect to each other, and a common reference element ER One among the two sensors elements is directed along the axis "Y" and will be referred to as vertical element EV hereinafter. The other sensor element is directed along the axis "X" and will be referred to as horizontal element EH hereinafter. The common reference element ER has a rectangular form. A horizontal edge of the common reference element ER faces the vertical element EV, and a vertical edge faces the horizontal element EH as illustrated in FIG. 8.

Preferably, the vertical element EV has a length lower than half the minimal wavelength of the electromagnetic field. The same applies to the horizontal element EH. By way of example, let it be assumed that the minimal wavelength is 8 mm as mentioned hereinbefore. In that case, the length of vertical element EV and that of the horizontal element EH may be, for example, 2 mm. In combination with the common reference element ER, the vertical element EV constitutes an antenna signal source having a capacitive impedance. The same applies to the horizontal element EH. The edges of the common reference element ER may have a width comprised between, for example, 1.5 and 2 mm.

The vertical element EV comprises an end that is near the longitudinal upper edge LB1. The horizontal element EH comprises an end that is near the longitudinal lower edge LB2. The horizontal edge of the common reference element ER, which faces the vertical element EV, is also located near the longitudinal lower edge LB2. It should be noted that there is a spacing of predetermined width between the vertical element EV and the common reference element ER. This predetermined width is substantially equal to the distance between the longitudinal upper edge LB1 and the longitudinal lower edge LB2, which corresponds to the width of the slot concerned, GA1 or GA2.

The term "near" as used in the preceding paragraph should be interpreted in the following way. The edge of the vertical element EV mentioned hereinbefore is sufficiently close to the longitudinal upper edge LB1 so that the vertical element EV is connectable by soldering to one of the first conducting areas $X1_1$-$X1_8$ illustrated in FIG. 6. Similarly, the edge of the horizontal element EH mentioned hereinbefore is sufficiently close to the longitudinal lower edge LB2 so that the horizontal element EH is connectable by soldering to one of the second conducting areas $X2_1$-$X2_8$ illustrated in FIG. 7. The horizontal edge of the common reference element ER mentioned hereinbefore is sufficiently close to longitudinal lower edge LB2 so that the common reference element ER is connectable by soldering to one of the third conducting areas $X3_1$-$X3_8$ illustrated in FIG. 7.

A first horizontal distance Dh1 separates the vertical element EV from a line that coincides with the vertical edge of the common reference element ER, which faces the horizontal element EH. A second horizontal distance Dh2 separates the horizontal element EH from the common reference element ER as illustrated in FIG. 8. These horizontal distances Dh1, Dh2 have optimized values allowing the horizontal element EH and the vertical element EV to have a relatively high level of polarization selectivity. That is, a horizontally polarized component of the electromagnetic field preferably induces only a relatively weak signal on the vertical element EV and, conversely, a vertically polarized component of the electromagnetic field preferably induces only a relatively weak signal on the horizontal element EH. In the context of this description, the first horizontal distance Dh1 may be comprised between, for example, 0.1 and 0.5 mm. The second horizontal distance Dh2 may be in the order of, for example, a few tenths of millimeters.

The optimized values of the horizontal distances Dh1, Dh2 may be determined by means of, for example, a simulation tool in the following manner. An excitation is applied to the vertical element EV, which simulates a vertically polarized field component at the horizontal element EH. In a reciprocal way, an excitation is applied to the horizontal element EH, which simulates a horizontally polarized field component at the vertical element EV. In an initial phase, the vertical element EV is placed at an initial location for which the first horizontal distance Dh1 would be, for example, infinitely small; close to zero. The horizontal element EH is placed at an initial location for which the second horizontal distance Dh2 would be relatively small like, for example, 0.1 mm.

In an optimization phase, the vertical element EV is moved along the axis "X" in the direction of the arrow representing this axis, while maintaining its location in the direction of the axis "Y". The horizontal element EH is also moved along the axis "X", but in the direction opposite to that of the arrow representing this axis. Respective signals, which are induced at the vertical element EV and the horizontal element EH, are observed during these respective displacements. Accordingly, a location for the vertical element EV and a location for the horizontal element EH can be found for which the induced signals are minimal. These locations define the optimized values for the first horizontal distance Dh1 and the second horizontal distance Dh2, respectively.

Figure 9:
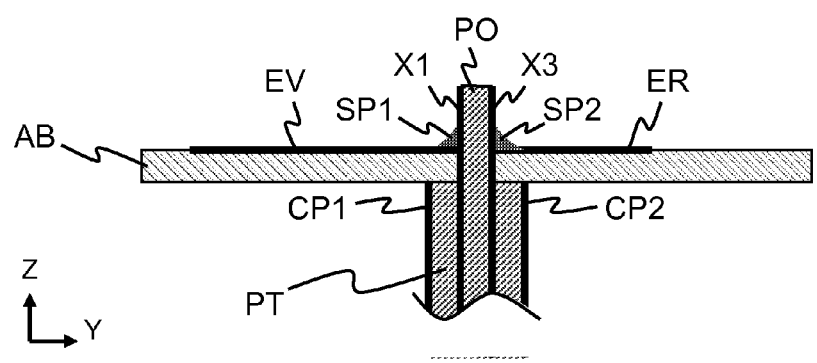
FIG. 9 is a schematic diagram illustrating a cut view of a zone in the probe module where an antenna bar is coupled to the printed circuit for signal transmission.

FIG. 9 illustrates, by means of a cut view, a zone in the printed circuit PT for signal transmission where the antenna device AD illustrated in FIG. 8 is coupled to printed circuit PT for signal transmission. The vertical element EV and the common reference element ER are illustrated in FIG. 9, as well as the antenna bar AB on which the antenna device AD is disposed. A portion of the first conducting plane CP1 and a portion of the second conducting plane CP2 illustrated in FIGS. 6 and 7, respectively, are also illustrated in FIG. 9.

FIG. 9 illustrates an extending portion PO of the printed circuit PT for signal transmission, which represents the first extending portion PO1 and the second extending portion PO2 illustrated in FIGS. 5, 6, and 7. The vertical element EV is mechanically and electrically coupled to a first conducting area X1 present on the extending portion PO by means of a solder bump SP1. Similarly, the horizontal element EH is mechanically and electrically coupled to a second conducting area by means of another solder bump, which is not illustrated in FIG. 9. Yet another solder bump SP2 mechanically and electrically couples the common reference element ER to a third conducting area X3, which is also present on the extending portion PO.

Figure 10:
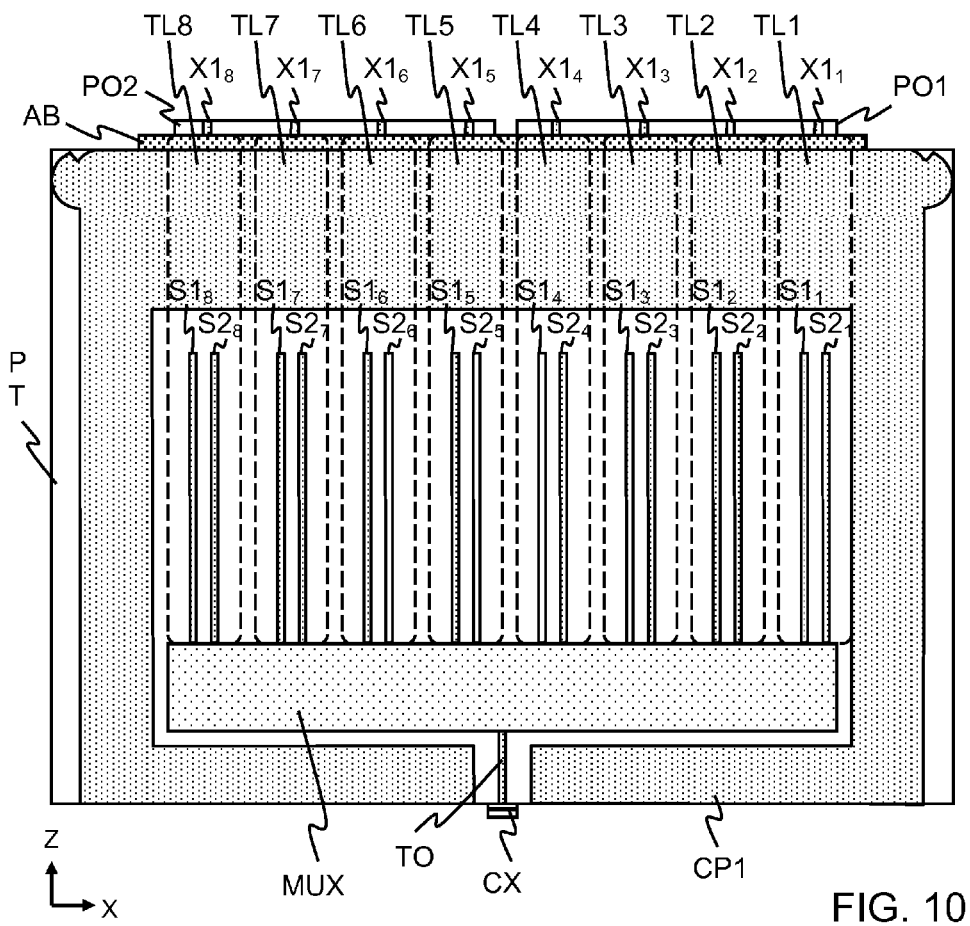

FIG. 10 illustrates the probe module when the cover CO illustrated in FIGS. 4 and 6 has been removed. FIG. 10 presents a view similar to that of FIG. 6. Consequently, the elements represented in FIG. 6 are also illustrated in FIG. 10, except for the cover CO. FIG. 10 illustrates that the printed circuit PT for signal transmission comprises 8 transmission lines TL1-TL8. The transmission lines TL1-TL8 each comprise a pair of conducting strips $S1_1$, $S2_1$-$S1_8$, $S2_8$. These pairs of conducting strips illustrated in FIG. 10 belong to the same conducting layer as the first conducting plane CP1, in the present case conducting layer CL1 illustrated in FIG. 3.

FIG. 10 further illustrates that the printed circuit PT for signal transmission comprises a multiplexer MUX. The transmission lines TL1-TL8 extend between the antenna devices AD1-AD8 illustrated in FIG. 5 and the multiplexer MUX. There is a transmission line for each antenna device. The multiplexer MUX is coupled to the cable connector CX by means of an output transmission line TO. The multiplexer MUX is arranged to select a conducting strip, which transmits an antenna signal, in dependence on the secondary selection signal SCS mentioned hereinbefore with reference to FIG. 1. The multiplexer MUX may comprise surface mounted devices (SMD).

Figure 11:
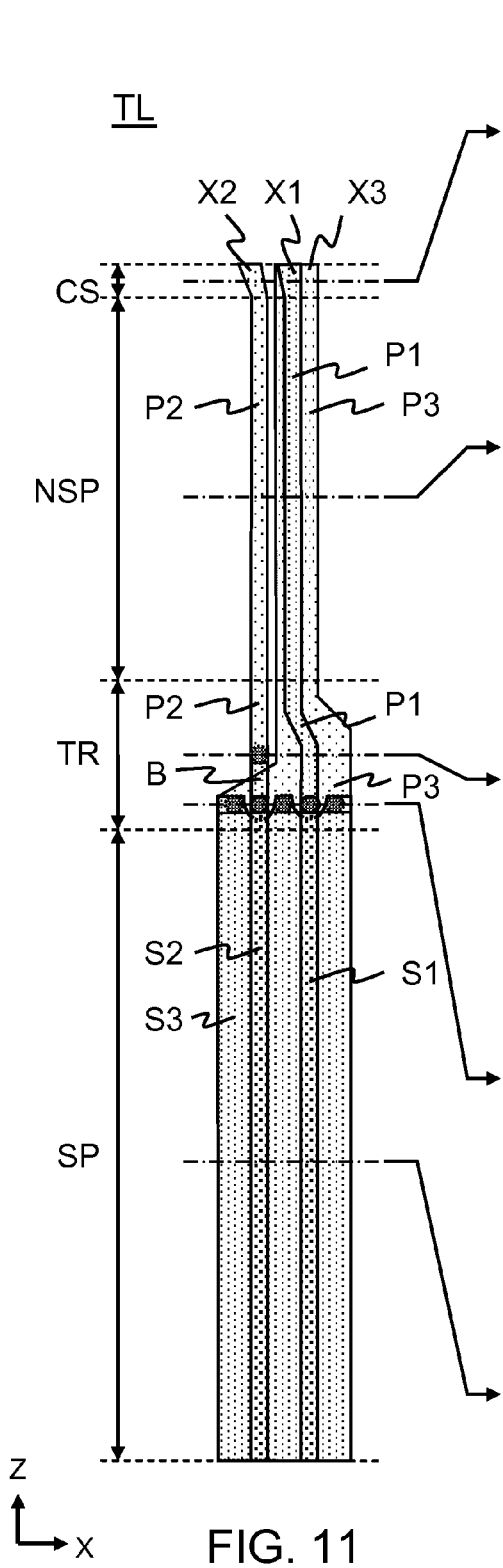
FIG. 11 is a schematic diagram illustrating a transmission line within the printed circuit for signal transmission.

FIGS. 11-16 schematically illustrate details of a transmission line TL, which is representative of the transmission lines TL1-TL8 illustrated in FIG. 10. FIG. 11 presents an overall picture as if it were possible to look through the printed circuit PT for signal transmission, whereby only conducting elements of the transmission line are visible. The transmission line TL comprises several sections: a contact section CS, a non-surfacing section NSP, a transition section TR, and a surfacing section SP. Preferably, the non-surfacing section NSP has a length of approximately one to ten times the maximum wavelength of the electromagnetic field to be measured. The non-surfacing section NSP may be, for example, 10 mm long. That is, referring in FIG. 6, there is a distance of approximately 10 mm between the antenna bar AB and the cover CO.

Figure 12:
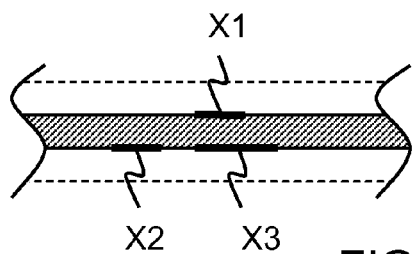
FIG. 12 is a schematic diagram illustrating a connection section of the transmission line by means of a partial cut view of the printed circuit for signal transmission.

FIG. 12 illustrates the contact section CS in more detail by means of a cut view. The contact section CS is located on an extending portion of the printed circuit PT for signal transmission, which may be the first extending portion PO1 or the second extending portion PO2 illustrated in FIG. 10. This section thus comprises a first conducting area X1, a second conducting area X2, and a third conducting area X3. As mentioned hereinbefore, the first conducting area X1 belongs to conducting layer CL2 illustrated in FIG. 3. The second conducting area X2 and the third conducting area X3 belong to conducting layer CL3.

Figure 13:
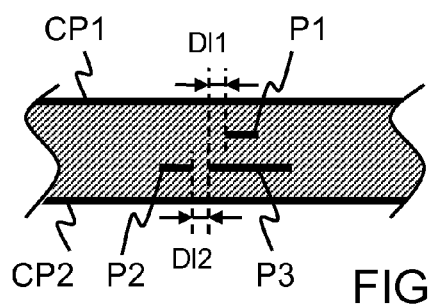
FIG. 13 is a schematic diagram illustrating a non-surfacing section of the transmission line by means of a partial cut view of the printed circuit for signal transmission.

FIG. 13 illustrates the non-surfacing section NSP in more detail by means of a cut view. The non-surfacing section NSP comprises several conducting paths: a first conducting path P1, a second conducting path P2, a third conducting path P3. The first conducting path P1 belongs to conducting layer CL2 illustrated in FIG. 3, like the first conducting area X1 in the contact section CS. In fact, the first conducting area X1 constitutes a widening of the first conducting path P1. This widening facilitates a coupling to a vertical element of an antenna device by means of soldering. The second conducting path P2 and the third conducting path P3 belong to conducting layer CL3, like the second conducting area X2 and the third conducting area X3 in the contact section CS. The second conducting area X2 constitutes a widening of the second conducting path P2. This widening facilitates a soldering to a horizontal element of the antenna device.

FIG. 13 illustrates that a first lateral distance DI1 separates an edge of the first conducting path P1 from a line coinciding with an edge of the third conducting path P3. The edges concerned are those which are closest to the second conducting path P2 as illustrated in FIG. 13. The first lateral distance DI1 has an optimized value allowing a relatively low level of interference between the first conducting path P1 and the second conducting path P2. That is, a signal present on the first conducting path P1 induces only a relatively weak signal on the second conducting path P2 and, reciprocally, a signal present on the second conducting path P2 induces only a relatively weak signal on the first conducting path P1.

The value optimized for the first lateral distance DI1 may be determined in a way similar to that used to determine the optimized values for the horizontal distances Dh1, Dh2 in the antenna device AD illustrated in FIG. 8. That is, a simulation tool may be used. In an initial phase, the first conducting path P1 is given an initial lateral position for which the first lateral distance DI1 is relatively small or even zero. In an optimization phase, the first lateral distance DI1 is gradually incremented while observing a level of interference between signals present on the first conducting path P1 and the second conducting path P2. The level of interference exhibits a minimum for a specific value of the first lateral distance DI1. This specific value can be retained as the optimized value.

FIG. 13 further illustrates that a second lateral distance DI2 separates the second conducting path P2 from the third conducting path P3. The second lateral distance DI2 has a value so that the above mentioned conducting paths constitute a two-wire transmission line having a desired characteristic impedance. The desired characteristic impedance typically corresponds to that of another two-wire transmission line formed by the first conducting path P1 and the third conducting path P3. The second lateral distance DI2 has a relatively small value, such as, for example, in the order of 0.1 mm in the context of this description.

Figure 14:
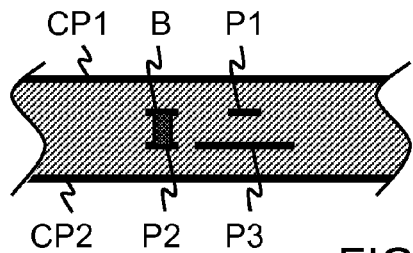
FIG. 14 is a schematic diagram illustrating a first level of a transition section of the transmission line by means of a partial cut view of the printed circuit for signal transmission.
Figure 15:
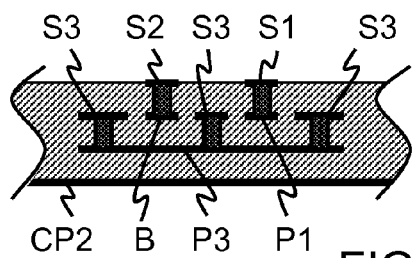
FIG. 15 is a schematic diagram illustrating a second level of a transition section of the transmission line by means of a partial cut view of the printed circuit for signal transmission.

FIGS. 14 and 15 illustrate the transition section TR in more detail by means of two cuts views at different levels. The transition section TR comprises several conducting through-holes and a conducting bridge B. The conducting through-holes are represented in FIG. 11 by relatively small circles with a dark gray filling. The transition section TR further comprises extensions of the conducting paths P1, P2, P3, which are part of the non-surfacing section NSP of the transmission line TL. The transition section TR further comprises extensions of the surfacing section SP. For this reason, the surfacing section SP will first be described in greater detail hereinafter, before describing further details of the transition section TR.

Figure 16:
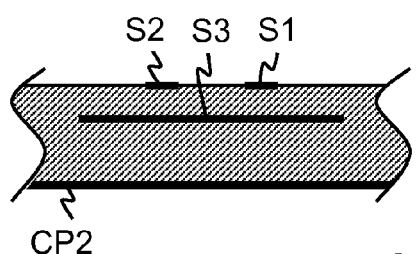
FIG. 16 is a schematic diagram illustrating a surfacing section of the transmission line by means of a partial cut view of the printed circuit for signal transmission.

FIG. 16 illustrates the surfacing section SP in more detail by means of a cut view. Surfacing section SP comprises several conducting strips: a first conducting strip S1, a second conducting strip S2, and a third conducting strip S3. The first conducting strip S1 and the second conducting strip S2 belong to conducting layer CL1 illustrated in FIG. 3. These conducting strips may correspond with any pair of conducting strips $S1_1$, $S2_1$-$S1_8$, $S2_8$ illustrated in FIG. 10. The third conducting strip S3 belongs to conducting layer CL2 illustrated in FIG. 3. This conducting strip has a relatively large width compared to the first conducting strip S1 and the second conducting strip S2, as illustrated in FIG. 11.

The conducting strips 51, S2, S3 in the surfacing section SP form a pair of micro-strip lines. In fact, the first conducting strip S1 and the third conducting strip S3 form a micro-strip line having a characteristic impedance. The second conducting strip S2 and the third conducting strip S3 form another micro-strip line having substantially the same characteristic impedance. Preferably, the characteristic impedance of the pair micro-strip lines corresponds to that of the two-wire transmission line formed by the first conducting path P1 and the third conducting path P3 in the non-surfacing section NSP. The characteristic impedance preferably also corresponds to that of the other two-wire transmission line formed by the second conducting path P2 and the third conducting path P3 in non-surfacing section NSP. That is, the non-surfacing section NSP and the surfacing section SP are preferably arranged in such way that the transmission line TL has a uniform characteristic impedance over its length.

The transition section TR establishes electrical connections between the non-surfacing section NSP of the transmission line TL and the surfacing section SP. Preferably, these electrical connections conform to the characteristic impedance of the transmission line TL. In more detail, FIG. 14 illustrates a conducting through-hole that connects the conducting bridge B in the transition section TR to the second conducting path P2, which extends from the non-surfacing section NSP. FIG. 15 illustrates a group of three conducting through-holes that connect the third conducting strip S3 to the third conducting path P3, which extends from the non-surfacing section NSP. Another conducting through-hole connects the second conducting strip S2 to the conducting bridge B, which is electrically coupled to the second conducting path P2 of the non-surfacing section NSP. Still another conducting through-hole connects the first conducting strip S1, which extends from the surfacing section SP, to the first conducting path P1, which extends from the non-surfacing section NSP.

Referring to FIG. 11, the first conducting path P1 and the first conducting strip S1, which are electrically coupled, form in fact a first signal conductor of the transmission line TL. The second conducting path P2 and the second conducting strip S2, as well as the conducting bridge B, form in fact a second signal conductor of the transmission line TL. The third conducting path P3 and the third conducting strip S3 form in fact a reference conductor of the transmission line TL.

Figure 17:
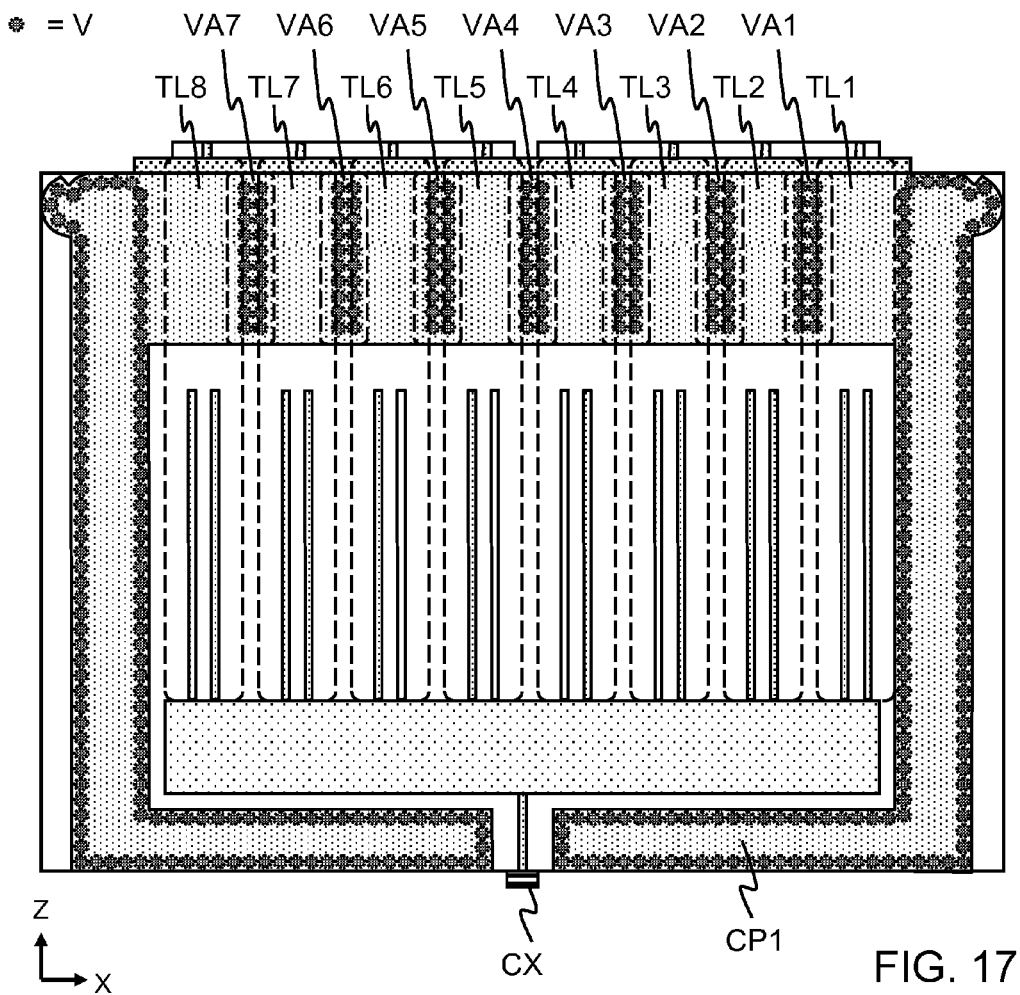
FIG. 17 is a schematic diagram illustrating conducting through-holes extending between a pair of external conducting layers of the printed circuit for signal transmission.

FIG. 17 illustrates the probe module by means of a selective semi transparent view that shows conducting through-holes V, which extend between the two external conducting layers of printed circuit PT for signal transmission. These conducting through-holes will be designated as fully traversing conducting through-holes V in what follows. The cover CO illustrated in FIGS. 4 and 6 is not represented in FIG. 17. Consequently, FIG. 17 presents a view similar to that of FIG. 10, except for the fully traversing conducting through-holes V, which are shown in FIG. 17.

Walls of fully traversing conducting through-holes V extend along a substantial part of the contour of the first conducting plane CP1 as illustrated in FIG. 17. These walls of fully traversing conducting through-holes V also extend along a substantial part of the contour of the second conducting plane CP2, which is partially symmetrical as illustrated in FIG. 7. As mentioned hereinbefore with reference to FIGS. 6 and 7, these contours include "parrot's beaks". The walls of fully traversing conducting through-holes V, which extend along the aforementioned contours, have thus two portions in the form of a "parrot's beak". There are also several rows VA1-VA7 of fully traversing conducting through-holes V arranged between the non-surfacing sections of the transmission lines TL1-TL8 as illustrated in FIG. 17.

The fully traversing conducting through-holes V and the first conducting plane CP1 illustrated in FIG. 17, as well as the second conducting plane CP2 illustrated in FIG. 7, form part of a shielding. The cover CO illustrated in FIGS. 4 and 6 also forms part of this shielding. The shielding prevents the electromagnetic field from reaching the transmission lines. The shielding typically forms part of an electric ground, which also comprises the reference conductors of the transmission lines mentioned hereinbefore in relation to FIG. 11. Preferably, the shielding and the reference conductors of the transmission lines are electrically coupled to each other by means of a coupling point near the cable connector CX. That is, this coupling point is preferably at a side opposite to that where the antenna bar AB is located. Such a layout of the electric ground avoids parasitic current loops, which the electromagnetic field could otherwise induce.

Figure 18:
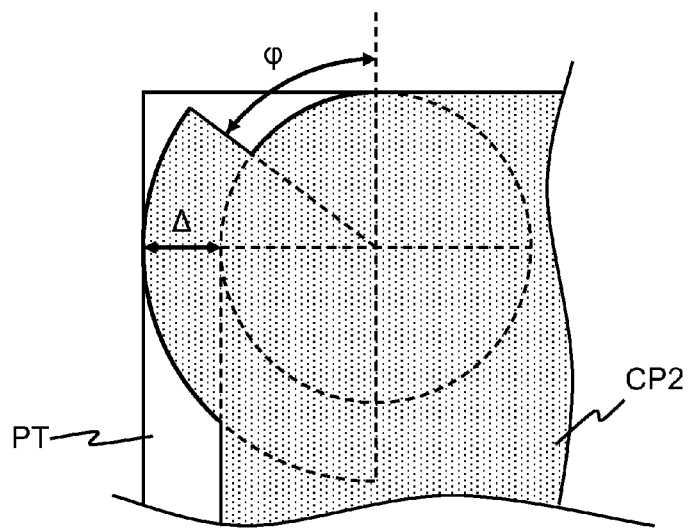
FIG. 18 is a schematic diagram illustrating details of a conducting structure arranged to attenuate a diffraction of the electromagnetic field.

FIG. 18 illustrates in more detail a choke formed in printed circuit PT for signal transmission. FIG. 18 can be regarded as a zoom in on the upper left corner of the printed circuit PT for signal transmission as illustrated in FIGS. 6 and 7. Consequently, FIG. 18 can be regarded as a front view or a rear view, respectively, of the choke. The choke is a conducting structure that has the form of a "parrot's beak". The conducting structure comprises two opposite and symmetrical faces, one belonging to the first conducting plane CP1 illustrated in FIG. 6, the other belonging to the second conducting plane CP2 illustrated in FIG. 7. The conducting structure further comprises the fully traversing conducting through-holes V that extend between these two faces of the "parrot's beak".

The choke contributes to obtaining a relatively high measurement precision for the following reasons. The printed circuit PT for signal transmission, of which the choke forms part, generates a diffraction of the electromagnetic field. This diffraction typically reaches the antenna bar AB and in particular the antenna devices AD at the ends of the antenna bar AB where the diffraction may have a relatively large amplitude. The diffraction is thus capable of distorting a measurement, in particular at the aforementioned antenna devices AD. The choke is capable of generating an echo of the electromagnetic field that is in phase opposition with the diffraction in a particular wavelength range, which may be designated as resonance wavelength range. The choke can thus cancel, at least partially, the diffraction of the electromagnetic field that would otherwise adversely affect measurement precision.

FIG. 18 illustrates two geometrical parameters of the choke: a sector angle $\phi$ and a thickness $\Delta$. These parameters allow adjusting the resonance wavelength range and can be optimized so that the diffraction is cancelled to the best possible extent. More specifically, the echo of the electromagnetic field has a phase that varies with the sector angle $\phi$ of the choke. The echo of the electromagnetic field has an amplitude that varies with the thickness $\Delta$ of the choke. However, the phase of the echo also varies with the thickness $\Delta$ and the amplitude also varies with the sector angle $\phi$, although to a lesser extent. It is therefore appropriate to determine a set of values, one for the sector angle $\phi$ and another for the thickness $\Delta$, for which the following ideal case is sufficiently well approximated, in particular at the ends of the antenna bar AB: the echo is in phase opposition with the diffraction and the amplitude of the echo is identical to that of diffraction.

It should be noted that the peripheral zones of printed circuit PT for signal transmission, which were mentioned with reference to FIG. 6, may also contribute to obtaining a relatively high measurement precision. The diffraction of the electromagnetic field is mainly caused by the corners of printed circuit PT for signal transmission. The broader the peripheral zones are, the more distant the corners are with respect to the antenna bar AB, and the weaker the diffraction is at the antenna devices located at the ends of the antenna bar AB. As such, the peripheral zones may thus significantly contribute to achieving a relatively high measurement precision in a medium with relatively strong losses. The peripheral zones of printed circuit PT for signal transmission preferably have a width in the order of 10 times the minimal wavelength or in the order of the maximum wavelength, whichever is greatest. In the present case, the width may be, for example, 1 to 2 cm.

FINAL REMARKS

The detailed description hereinbefore with reference to the drawings is merely an illustration of the invention and the additional features, which are defined in the claims. The invention may be implemented in numerous different ways. In order to illustrate this, some alternatives are briefly indicated.

The invention may be applied to advantage in numerous types of products and methods involving a measurement of an electromagnetic field. Determining the specific absorption rate is merely an example. The invention may also be used, for example, for characterizing an electromagnetic field in a space in order to determine zones where the electromagnetic field is relatively strong or relatively weak.

There are various different ways of arranging antenna devices. For example, the antenna devices may be grouped on a single substrate. This substrate may then include a matrix of antennas. It is also possible to implement each antenna device on a separate substrate. In such an implementation there will be thus as many substrates as antenna devices. A substrate, such as an antenna bar, may comprise perforations. A substrate may comprise any desired number of antenna devices. The antenna devices need not necessarily be aligned.

There are various different ways of implementing a printed circuit for signal transmission. Such a printed circuit may include analog and digital processing circuits, such as, for example amplifiers, frequency converters, and analog-to-digital converters. By contrast, it is not necessary for such a printed circuit to comprise a signal handling circuit. For example, referring to FIG. 10, the multiplexer MUX may be removed from the printed circuit PT for signal transmission and disposed elsewhere in the system. A printed circuit for signal transmission need not necessarily comprise four conducting layers as illustrated in FIG. 3. For example, such a printed circuit may comprise a greater number of conducting layers, which may allow an implementation without any cover. A printed circuit for signal transmission need not necessarily comprise two extending portions as illustrated in FIGS. 5, 6, and 7. For example, such a printed circuit may comprise a single extending portion or, as another example, a separate extending portion for each antenna device. A printed circuit for signal transmission may comprise various different chokes that have different resonance wavelength ranges. This allows compensation for diffraction over a relatively wide wavelength range. Referring to FIG. 18, different chokes may have different sector angles $\phi$ and different thicknesses $\Delta$.

There are various different ways of implementing a system for measuring an electromagnetic field in accordance with the invention. For example, a system may comprise a single probe module in accordance with the invention, and a device to move this probe module in order to cover a measurement surface. Techniques other than soldering can be used for mechanically and electrically coupling a substrate comprising antenna devices to a printed circuit for signal transmission. For example, a clips mechanism can be used.

The term "printed circuit" should be understood in a broad sense. This term embraces any type of substrate in which transmission lines may be implemented. The terms "transmit" and "transmitting" in relation with a transmission line, indicate that the transmission line guides a signal from one point to another point, such as, for example, from an antenna device to an output on a printed circuit that comprises the transmission line.

The remarks made hereinbefore demonstrate that the detailed description with reference to the drawings is an illustration of the invention rather than a limitation. The invention can be implemented in numerous alternative ways that are within the scope of the appended claims. All changes that come within the meaning and range of equivalency of the claims are to be embraced within their scope. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that respective dependent claims define respective additional features, does not exclude combinations of additional features other than those reflected in the claims.

The invention claimed is:

1. A system for measuring an electromagnetic field comprising:
a plane substrate on which an antenna device is disposed at a particular location, the antenna device being arranged to provide a pair of signals representative of a pair of orthogonal components of the electromagnetic field at the particular location where the antenna device is located on the plane substrate; and
a printed circuit for signal transmission, the printed circuit being orthogonally disposed with respect to the plane substrate on which the antenna device is disposed, whereby an edge of the printed circuit touches the plane substrate and traverses the particular location where the antenna device is located, the printed circuit including a transmission line coupled to the antenna device, the transmission line comprising a first and a second signal conductor arranged to transmit the pair of signals provided by the antenna device towards a measurement module.

2. A system according to claim 1, in which the antenna device comprises a first element and a second element orthogonally disposed with respect to each other, and a common reference element.

3. A system according to claim 2, in which the antenna device is implemented on a printed circuit other than the printed circuit for signal transmission.

4. A system according to claim 3, in which:
the printed circuit for signal transmission comprises an extending portion having a pair of main faces at opposite sides of the extending portion, one of the main faces comprising a first conducting area coupled to the first signal conductor of the transmission line, the other main face comprising a second conducting area and a third conducting area coupled to the second signal conductor and a reference conductor, respectively, of the transmission line; and
the printed circuit on which the antenna device is implemented comprises a slot arranged to accommodate the extending portion, the slot having a pair of longitudinal edges, a portion of the first element being located at one of the longitudinal edges so that first element is connectable by soldering to the first conducting area of the extending portion, a portion of the second element, and a portion of the common reference element being located at the other longitudinal edge of the slot, so that the second element and the common reference element are connectable by soldering to the second conducting area and the third conducting area, respectively, of the extending portion.

5. A system according to claim 4, in which the printed circuit for signal transmission comprises:
a pair of external conducting layers at opposite sides of the printed circuit;
several internal conducting layers; and
several non-conducting layers, a non-conducting layer separating two conducting layers.

6. A system according to claim 5, in which:
the first conducting area of the extending portion constitutes an end of a first conducting path belonging to a first internal conducting layer;
the second conducting area and the third conducting area constitute an end of a second conducting path and an end of a third conducting path, respectively, belonging to a second internal conducting layer; and
the first conducting path, the second conducting path, and the third conducting path correspond to the first signal conductor, the second signal conductor, and the reference conductor, respectively, in a non-surfacing section of the transmission line.

7. A system according to claim 6, in which the first conducting path, the second conducting path, and the third conducting path are positioned with respect to each other so that there is a lateral distance between, on the one hand, an edge of the first conducting path that is closest to the second conducting path and, on the other hand, a line coinciding with an edge of the third conducting path that is closest to the second conducting path.

8. A system according to any of claims 6 and 7, in which the transmission line comprises:
a surfacing section in the form of a pair micro-strip lines formed by a first conducting strip and a second conducting strip belonging to an external conducting layer of the pair of external conducting layers, and by a third conducting strip belonging to one among the several internal conducting layers, the first conducting strip, the second conducting strip, and the third conducting strip corresponding to the first signal conductor, the second signal conductor, and the reference conductor, respectively, in the surfacing section of the transmission line; and a transition section provided with conducting through-holes for electrically coupling the first conducting strip, the second conducting strip, and the third conducting strip with the first conducting path, the second conducting path, and the third conducting path, respectively, of the non-surfacing section.

9. A system according to claim 8, in which the second conducting path and the third conducting path are separated from each other by a distance so that these conducting paths constitute a two-wire transmission line having a characteristic impedance corresponding to a characteristic impedance of a micro-strip line formed by the second conducting strip and the third conducting strip.

10. A system according to claim 6 or 7, in which the printed circuit for signal transmission comprises several transmission lines comparable with the transmission line defined hereinbefore, at least a portion of the pair of the external conducting layers being part of a shielding for preventing the electromagnetic field from reaching the transmission lines.

11. A system according to claim 10, in which a series of conducting through-holes is arranged between two non-surfacing sections of two neighboring transmission lines, the series of conducting through-holes extending between the pair of external conducting layers so that the series of conducting through-holes is part of the shielding.

12. A system according to claim 10, in which the printed circuit for signal transmission generates a diffraction of the electromagnetic field, the printed circuit for signal transmission comprising:

a pair of peripheral zones at sides opposite of a central zone in which the transmission lines are located, a peripheral zone being provided with a conducting structure arranged to generate an echo of the electromagnetic field in phase opposition with the diffraction.

13. A system according to claim 12, in which the conducting structure comprises a pair of conducting planes formed in the pair of external conducting layers and further comprises at least a portion of the conducting through-holes extending between the pair of conducting planes, the conducting through-holes forming an edge of the conducting structure.

14. The system according to claim 12, in which the printed circuit for signal transmission is provided with a cover which is part of the shielding and covering at least surfacing sections of the transmission lines.

15. A system according to claim 1, the system comprising:
several arrays of antenna devices, the arrays being arranged in parallel; and
several printed circuits for signal transmission, a printed circuit being associated with a particular array of antenna devices, the measurement module being arranged to establish a three-dimensional representation electromagnetic field on the basis of respective pairs of signals coming from respective antenna devices belonging to respective arrays.

16. A system for measuring an electromagnetic field comprising:
an array of antenna devices disposed on at least one plane substrate, the array of antenna devices being arranged to provide antenna signals that comprise amplitude information and phase information of a pair of orthogonal components of the electromagnetic field for respective points where respective antenna devices are located, whereby an antenna device is entirely disposed on a single plane substrate and arranged to provide a pair of signals representative of the pair of orthogonal components of the electromagnetic field; and
a printed circuit for signal transmission, the printed circuit being orthogonally disposed with respect to the at least one plane substrate on which the array of antenna devices is disposed, whereby an edge of the printed circuit touches the at least one plane substrate and traverses respective points where respective antenna devices are located, the printed circuit including a transmission line coupled to an antenna device, the transmission line comprising a first and a second signal conductor arranged to transmit the pair of signals provided by the antenna device towards a measurement module.

* * * * *